United States Patent
Hishinuma

(10) Patent No.: US 8,476,804 B2
(45) Date of Patent: Jul. 2, 2013

(54) PIEZOELECTRIC MEMS ELEMENT, VOLTAGE CONTROL OSCILLATOR, COMMUNICATION APPARATUS, AND METHOD OF MANUFACTURING PIEZOELECTRIC DRIVE TYPE MEMS ELEMENT

(75) Inventor: Yoshikazu Hishinuma, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 374 days.

(21) Appl. No.: 12/882,391

(22) Filed: Sep. 15, 2010

(65) Prior Publication Data

US 2011/0074248 A1 Mar. 31, 2011

(30) Foreign Application Priority Data

Sep. 29, 2009 (JP) ................................. 2009-223738

(51) Int. Cl.
*H01L 41/08* (2006.01)
*H01L 41/047* (2006.01)

(52) U.S. Cl.
USPC ........... 310/324; 310/369; 310/365; 310/366; 310/330

(58) Field of Classification Search
USPC ................ 310/330, 332, 331, 369, 365, 364, 310/324, 321, 322, 334, 311, 328
IPC ........................................... H01L 41/047,41/08
See application file for complete search history.

(56) References Cited

U.S. PATENT DOCUMENTS

| | | | | |
|---|---|---|---|---|
| 4,170,742 A | * | 10/1979 | Itagaki et al. | 310/324 |
| 7,538,477 B2 | * | 5/2009 | Fazzio et al. | 310/366 |
| 8,110,963 B2 | * | 2/2012 | Funasaka et al. | 310/324 |
| 8,344,595 B2 | * | 1/2013 | Funasaka et al. | 310/324 |
| 8,385,013 B2 | * | 2/2013 | Hishinuma | 359/824 |
| 2004/0251781 A1 | * | 12/2004 | Bouche et al. | 310/324 |
| 2008/0079783 A1 | | 4/2008 | Fujii | |

(Continued)

FOREIGN PATENT DOCUMENTS

| | | |
|---|---|---|
| JP | 2005-313274 A | 11/2005 |
| JP | 2008-81801 A | 4/2008 |

(Continued)

OTHER PUBLICATIONS

Lee et al., "Imprint of (Pb,La)(Zr,Ti)O3 thin films with various crystalline qualities", Appl. Phys. Lett. vol. 68, No. 4, Jan. 22, 1996, pp. 484-486.

(Continued)

*Primary Examiner* — Thomas Dougherty
*Assistant Examiner* — Karen B Addison
(74) *Attorney, Agent, or Firm* — Birch, Stewart, Kolasch & Birch, LLP

(57) ABSTRACT

A piezoelectric drive type MEMS element includes: a first substrate including, in a portion thereof, a movable part which is driven by a piezoelectric drive section to be displaced in a convex shape, a movable electrode being provided on a surface of the movable part; and a second substrate which is bonded to the first substrate and supports a fixed electrode facing the movable electrode via a prescribed gap, wherein the piezoelectric drive section includes a piezoelectric film provided on a region of the first substrate which forms the movable part as a portion of the movable part, and a pair of electrodes disposed so as to sandwich the piezoelectric film.

14 Claims, 6 Drawing Sheets

U.S. PATENT DOCUMENTS

| | | | |
|---|---|---|---|
| 2008/0081128 A1 | 4/2008 | Fujii | |
| 2008/0081215 A1 | 4/2008 | Fujii | |
| 2008/0081216 A1 | 4/2008 | Fujii et al. | |
| 2009/0289998 A1* | 11/2009 | Tanaka et al. | 347/68 |
| 2012/0206014 A1* | 8/2012 | Bibl et al. | 310/331 |

FOREIGN PATENT DOCUMENTS

| | | |
|---|---|---|
| JP | 2008-81802 A | 4/2008 |
| JP | 2008-81803 A | 4/2008 |
| JP | 2008-106353 A | 5/2008 |

OTHER PUBLICATIONS

Okamura et al., "Conspicuous Voltage Shift of D-E Hysteresis Loop and Asymmetric Depolarization in Pb-Based Ferroelectric Thin Films", Jpn. J. Appl. Phys. vol. 38, pt. 1, No. 9B, Sep. 1999, pp. 5364-5367.

* cited by examiner

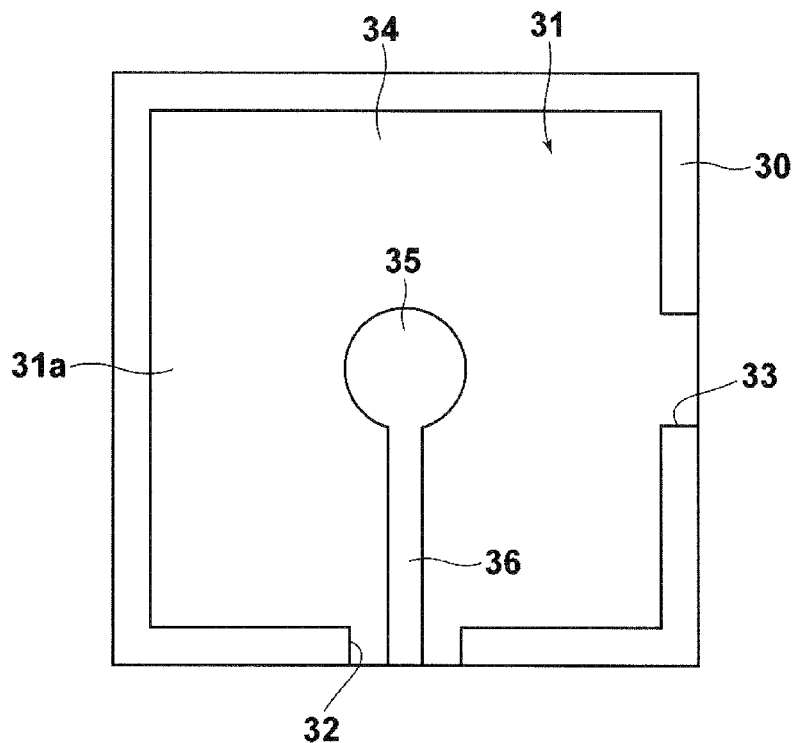
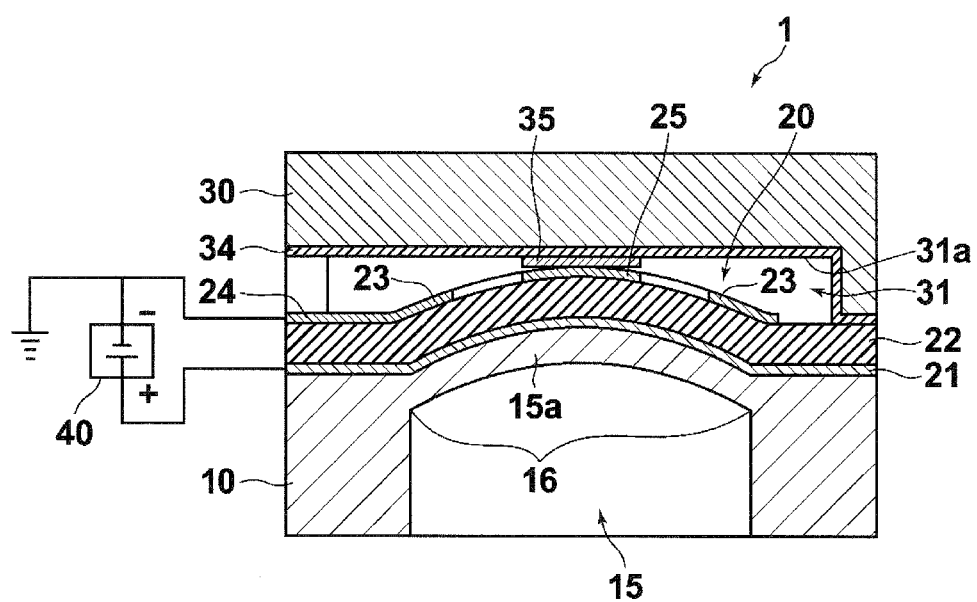

PIEZOELECTRIC MEMS ELEMENT, VOLTAGE CONTROL OSCILLATOR, COMMUNICATION APPARATUS, AND METHOD OF MANUFACTURING PIEZOELECTRIC DRIVE TYPE MEMS ELEMENT

BACKGROUND OF THE INVENTION

1. Field of the Invention

The present invention relates to a piezoelectric drive type Micro Electro Mechanical System (MEMS) element which is used as a switch, a variable capacitor, or the like, and to a voltage control oscillator, a communication apparatus, and a method of manufacturing piezoelectric drive type MEMS element.

2. Description of the Related Art

In recent years, there has been progressive expansion in the range of application of MEMS technology in semiconductor processes. For example, in the field of high-frequency circuits, there are high expectations for the application of this technology to switches and variable capacitors.

An electrostatic drive mechanism employing static electricity has been used principally as the drive mechanism for a conventional MEMS switch or variable capacitor. This is because the material and structure are simple and the process is straightforward. A typical structure is one comprising a substrate provided with an electrode for generating electrostatic force and a fixed electrode for ohmic contact, and a conductive movable beam which is suspended over the substrate. By applying a voltage between the electrostatic force generating electrode and the movable beam, an attraction is created by the electrostatic force in such a manner that the fixed electrode and the movable electrode of the movable beam make contact with each other, whereby a switch is opened and closed. In order to achieve sufficient isolation of the switch, it is desirable that the fixed electrode of the substrate and the movable electrode of the movable beam should be set at least 1 µm apart. Since the electrostatic force decreases sharply in inverse proportion to the square of the distance between the electrodes, the spring constant is set to be relatively weak, and furthermore, in order to displace the movable beam by 1 µm or more, it is usually necessary to have a high voltage of 20 V or above as the electrostatic drive voltage. When the fixed electrode and the movable electrode make contact with each other, a strong force of attraction is generated, but since their separating action is dependent only on the force of the spring, then the separating force is weak and there is a possibility that the contact may become stuck and reliability is poor.

On the other hand, in recent years, developments have been made in piezoelectric film formation technologies for forming piezoelectric films directly onto a structural substrate, and investigation has also been carried out into piezoelectric drive mechanisms using piezoelectric force as a drive mechanism for a MEMS switch. A conceivable piezoelectric drive mechanism is one which comprises a substrate provided with a fixed electrode and a piezoelectric drive movable beam provided with a movable electrode suspended on the substrate and a piezoelectric element. The piezoelectric force is proportional to the voltage and is not dependent on the distance between the movable electrode and the fixed electrode. Furthermore, piezoelectric driving makes it possible to achieve greater displacement at a low voltage compared to electrostatic driving, and therefore the spring force can be raised accordingly, thus strengthening the separating force and making it possible to improve reliability.

Japanese Patent Application Publication No. 2005-313274 describes a piezoelectric drive type MEMS element, for example. Japanese Patent Application Publication No. 2005-313274 discloses an element having a structure comprising a movable part using a beam supported at both ends, as a piezoelectric drive type of MEMS element which can be manufactured stably and with good reliability.

However, the piezoelectric drive type of MEMS element described in Japanese Patent Application Publication No. 2005-313274 requires a complex process in order to manufacture the beam structure supported at both ends, involving: (i) providing a sacrificial layer on the substrate, (ii) forming a both-end-supported beam structure portion on the sacrificial layer, (iii) creating a cavity by etching from the rear surface of the substrate, and (iv) removing the sacrificial layer, and so on; hence, there are possibilities that it is difficult to raise the yield and lower costs.

SUMMARY OF THE INVENTION

The present invention has been contrived in view of the circumstances described above, an object thereof being to provide a piezoelectric MEMS element, a voltage control oscillator, a communication apparatus, and a method of manufacturing piezoelectric drive type MEMS element whereby the manufacturing steps are simple, yield can be improved and costs can be curbed.

In order to attain an object described above, one aspect of the present invention is directed to a piezoelectric drive type MEMS element comprising: a first substrate including, in a portion thereof, a movable part which is driven by a piezoelectric drive section to be displaced in a convex shape, a movable electrode being provided on a surface of the movable part; and a second substrate which is bonded to the first substrate and supports a fixed electrode facing the movable electrode via a prescribed gap, wherein the piezoelectric drive section includes a piezoelectric film provided on a region of the first substrate which forms the movable part as a portion of the movable part, and a pair of electrodes disposed so as to sandwich the piezoelectric film.

Desirably, the first substrate includes a diaphragm as a portion of a surface thereof; the pair of electrodes are composed of a lower electrode which is formed on the first substrate, and an upper electrode which is provided along a region corresponding to a peripheral edge of the diaphragm, on the piezoelectric film formed on the lower electrode; and the movable part includes the diaphragm, the lower electrode provided on the diaphragm, and the piezoelectric film.

Desirably, the second substrate has a recess section in a surface thereof and is bonded to the first substrate in such a manner that a bottom face of the recess section faces a surface of the first substrate; and the fixed electrode is provided at a position facing the movable electrode, on the bottom face of the recess section of the second substrate.

Desirably, a peripheral edge of the movable part is circular, and the upper electrode is a continuous or non-continuous ring electrode formed along the peripheral edge.

Desirably, an outer circumferential diameter of the ring electrode is greater than a diameter of the peripheral edge of the movable part, and an inner circumferential diameter of the ring electrode is smaller than the diameter of the peripheral edge of the movable part.

Desirably, the piezoelectric film has a spontaneous polarization which is oriented in a direction from the lower electrode toward the upper electrode; and when a voltage is applied between the lower electrode and the upper electrode in such a manner that a potential of the lower electrode is higher than a potential of the upper electrode, the movable part is driven and displaced in a direction such that the movable electrode moves towards the fixed electrode.

Desirably, when a voltage is applied between the pair of electrodes, the movable part is driven and displaced in such a manner that the movable electrode makes contact with the fixed electrode to serve as a switch. In this case, the piezoelectric drive type MEMS element may be used as a switch device.

Desirably, when a variable voltage is applied between the pair of electrodes, the movable part is driven and displaced in such a manner that a distance between the movable electrode and the fixed electrode is changed to serve as a variable capacitor. In this case, the piezoelectric drive type MEMS element may be used as a variable capacitor device.

Desirably, the diaphragm has a circular shape.

Desirably, the piezoelectric film contains a perovskite type oxide.

In order to attain an object described above, another aspect of the present invention is directed to a voltage control oscillator comprising: a variable capacitor formed by the piezoelectric drive type MEMS element; a resonator connected to the variable capacitor; and an amplifier connected to the variable capacitor.

Desirably, the movable electrode is provided in a region corresponding to a central portion of the surface of the movable part.

In order to attain an object described above, another aspect of the present invention is directed to a communication apparatus comprising: an antenna; and a matching circuit which is connected to the antenna and includes an inductor element and a variable capacitor formed by the piezoelectric drive type MEMS element.

In order to attain an object described above, another aspect of the present invention is directed to a communication apparatus comprising: an antenna; a matching circuit connected to the antenna; a first band switch and a second band switch each of which is connected to the matching circuit and formed by the piezoelectric drive type MEMS element; a first transmit-receive circuit connected to the first band switch; and a second transmit-receive circuit connected to the second band switch.

In order to attain an object described above, one of the aspects of the present invention is directed to a method of manufacturing a piezoelectric drive type MEMS element, comprising the steps of: forming a first substrate including a diaphragm as a portion of a surface thereof; forming a lower electrode on the first substrate; forming a piezoelectric film on the lower electrode; forming an upper electrode along a region corresponding to a peripheral edge of the diaphragm, on the piezoelectric film, and forming a movable electrode on the piezoelectric film; forming a second substrate having a recess section in one surface thereof and having a fixed electrode provided on a bottom face of the recess section; and bonding the first substrate on which the upper electrode and the movable electrode are provided and the second substrate, in such a manner that the fixed electrode and the movable electrode face each other.

Desirably, the first substrate includes: a handle layer; an etching stop layer superimposed on the handle layer; and a diaphragm forming layer superimposed on the etching stop layer; and the diaphragm is formed by etching a portion of the handle layer up to the etching stop layer.

Desirably, the diaphragm is formed by the steps of: forming a cavity in a base substrate; bonding the base substrate to a wafer substrate including a diaphragm forming layer and a handle layer superimposed on the diaphragm forming layer, in such a manner that the diaphragm forming layer closes off the cavity in the base substrate; and removing the handle layer from the wafer substrate bonded to the base substrate.

A piezoelectric drive type MEMS element according to the present invention has a simple structure comprising: a first substrate having, in a portion thereof, a movable part which is driven by a piezoelectric drive section and displaced in a convex shape, a movable electrode being provided on the surface of the movable part; and a second substrate, bonded to the first substrate, which supports a fixed electrode facing the movable electrode via a prescribed gap. Therefore, the manufacturing method for same can be made simple, without having to include steps for fabricating and removing a sacrificial layer, and hence production yield can be improved and manufacturing costs can be suppressed.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein:

FIG. 3 is a plan diagram showing one surface of a second substrate on which a fixed element is formed, of the MEMS element shown in FIG. 1;

FIG. 4A is a cross-sectional diagram showing a state during driving in a case where the MEMS element shown in FIG. 1 is used as a switch;

DESCRIPTION OF THE PREFERRED EMBODIMENTS

Below, an embodiment of the present invention is described with reference to the drawings.

Piezoelectric Drive Type MEMS Element

Figure 1:
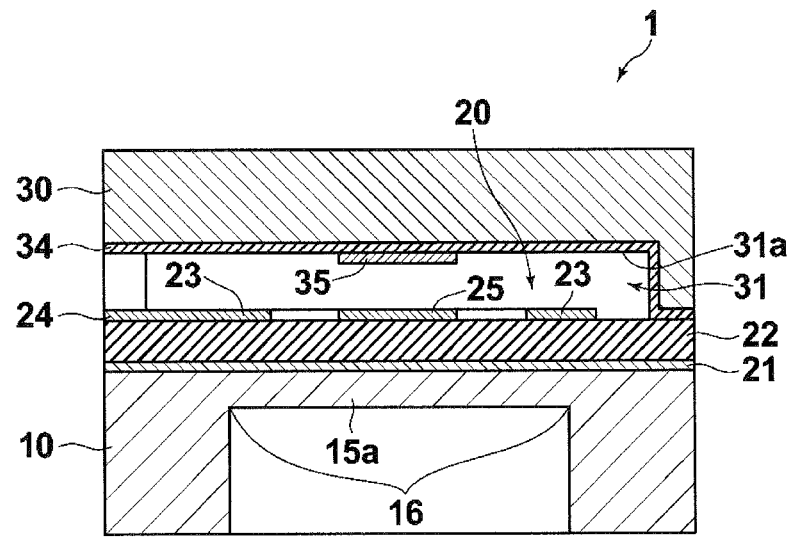
FIG. 1 is a cross-sectional diagram showing the principal part of a piezoelectric drive type MEMS element according to a first embodiment.

FIG. 1 is a principal part cross-sectional diagram (a cross-section in the thickness direction of the piezoelectric element) of a piezoelectric drive type MEMS element 1 relating to a present embodiment of the present invention. To clarify the illustration, the scale of the constituent elements is changed appropriately from the actual scale (the same applies to the drawings described below).

The piezoelectric drive type MEMS element 1 according to the present embodiment comprises, in one portion, a movable part 16 which is displaced in a convex shape by being driven by a piezoelectric driving section 20, and comprises a first substrate 10 and a second substrate 30 bonded to the first substrate 10. In the first substrate 10, a movable electrode 25 is provided in the central portion of the surface of the movable part 16. The second substrate 30 supports a fixed electrode 35 at a position opposing the movable electrode 25.

The first substrate 10 comprises a diaphragm 15a as a portion of the surface thereof. The diaphragm 15a is constituted by a thin plate-shaped portion (thin film) which is sufficiently thin with respect to the thickness of the substrate 10. A diaphragm structure is constituted by the portion of the substrate which supports the diaphragm 15a and forms the peripheral wall of the cavity 15 below the diaphragm 15a. The planar shape of the diaphragm 15a may be any shape, such as a square shape, circular shape, or the like, but a circular shape, as adopted in the present embodiment, is desirable from the viewpoint of avoiding cracks and damage, and the like, due to concentration of stress during vibration. Furthermore, a piezoelectric drive section 20 comprises a piezoelectric film 22 provided as a portion of the movable part 16 on the region of the first substrate 10 which forms the movable part 16, and a pair of electrodes 21, 23 which are disposed so as to sandwich this piezoelectric film 22. The pair of electrodes comprises a lower electrode 21 which is formed on the diaphragm 15a of the first substrate 10, and an upper electrode 23 which is formed on the piezoelectric film 22 formed on the lower electrode 21, along the region corresponding to the peripheral edge 15e of the diaphragm 15a. Consequently, the movable part 16 is constituted by the diaphragm 15a, the lower electrode 21 which is provided on top of the diaphragm 15a, and the piezoelectric film 22, and the movable electrode 25 is provided on top of the piezoelectric film 22, similarly to the upper electrode 23.

Figure 2:
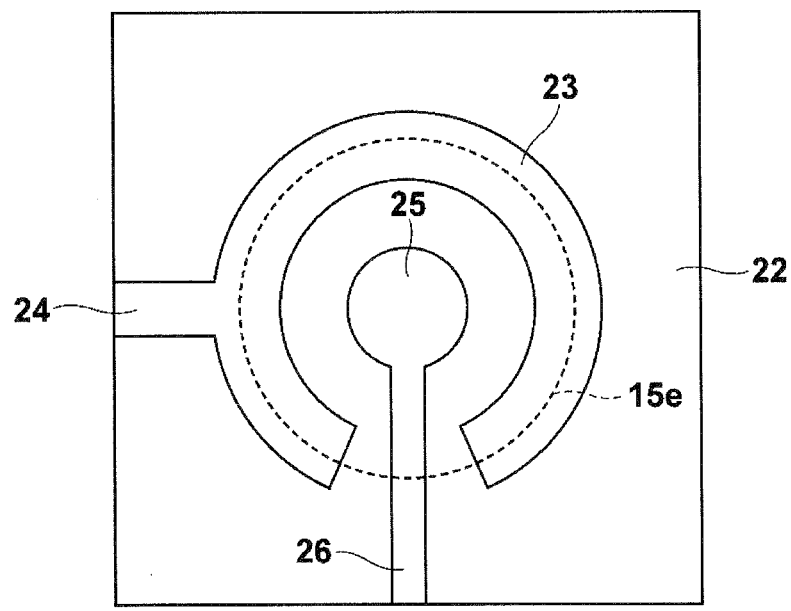
FIG. 2 is a plan diagram showing an electrode pattern provided on a piezoelectric film of the MEMS element shown in FIG. 1.

FIG. 2 is a plan diagram showing an electrode pattern provided on the piezoelectric film 22 in the MEMS element 1 according to the present embodiment.

As shown in FIG. 2, the upper electrode 23 is formed in a C shape following the region corresponding to the peripheral edge 15e of the diaphragm 15a on the piezoelectric film 22. The C-shaped electrode is one mode of a non-continuous ring electrode.

Furthermore, in the present embodiment, the upper electrode (ring electrode) 23 is formed in such a manner that the outer circumferential diameter thereof is larger than the diameter of the peripheral edge 15e of the diaphragm 15a and the inner circumferential diameter thereof is equal to or less than the diameter of the peripheral edge 15e of the diaphragm 15a. By providing the outer periphery of the upper electrode 23 so as to be located to the outside of the peripheral edge 15e of the diaphragm 15a in this way, it is possible to achieve a sufficient amount of displacement of the diaphragm 15a when driven.

On the other hand, the movable electrode 25 is provided in a circular shape in the region on the piezoelectric film 22 corresponding to the central portion of the diaphragm 15a, in other words, in the central portion of the movable part 16 which is separated from the upper electrode 23 to the inner side of the inner circumference of the C-shaped upper electrode 23.

Moreover, a lead wire 24 for connecting the C-shaped upper electrode 23 to a power source, and a lead wire 26 from the movable electrode 25 are provided on the piezoelectric film 22.

A second substrate 30 has a recess section 31 provided in one face thereof, and is bonded to the first substrate 10 in such a manner that the bottom face 31a of the recess section 31 faces the front surface of the first substrate 10. Furthermore, the fixed electrode 35 is provided on the bottom face 31a of the second substrate 30 at a position opposing the movable electrode 25.

FIG. 3 is a plan diagram showing one surface of the second substrate 30 on which the recess section 31 is provided, in the MEMS element according to the present embodiment.

As shown in FIG. 3, a square-shaped recess section 31 and wiring groove sections 32 and 33 connected to this recess section 31 are provided in the second substrate 30 according to the present embodiment, and an $SiO_2$ film 34 is formed over the entire surface thereof.

The fixed electrode 35 is provided in a circular shape in the central portion of the bottom face 31a of the recess section 31, and furthermore, a lead wire 36 from the fixed electrode 35 is formed along the groove section 32 from the bottom face 31a of the recess section 31.

In the MEMS element 1 according to the present embodiment, the spontaneous polarization of the piezoelectric film 22 is oriented from the side of the lower electrode 21 toward the side of the upper electrode 23, and by applying a voltage between the lower electrode 21 and the upper electrode 23 in such a manner that the potential of the lower electrode 21 is higher than the potential of the upper electrode 23, the piezoelectric film below the upper electrode 23 contracts, the portion of the piezoelectric film in the movable part 16 where the upper electrode 23 is not formed extends in the direction of the film plane, and consequently, the movable part 16 is driven and displaced in a direction whereby the movable electrode 25 moves towards the fixed electrode 35. If a piezoelectric film is used in which the direction of spontaneous polarization is opposite to that of the present embodiment, in other words, from the side of the upper electrode 23 toward the side of the lower electrode 21, then a composition should be adopted to apply a voltage between the electrodes in such a manner that the potential of the upper electrode 23 is higher than the potential of the lower electrode 21.

There are no restrictions on the materials of the substrate 10 and the substrate 30, and it is possible to use a substrate of silicon, glass, stainless steel (SUS), yttrium-stabilized zirconia (YSZ), alumina, sapphire, silicon carbide, or the like, for them. Furthermore, it is also possible to use a laminated substrate, such as an SOI substrate, for them.

There are no particular restrictions on the main component of the lower electrode 21, and metals or metal oxides such as Au, Pt, Ir, $IrO_2$, $RuO_2$, $LaNiO_3$, $SrRuO_3$, or the like, or combinations of these, are possible.

There are no particular restrictions on the main components of the upper electrode 23, the movable electrode 25 and the fixed electrode 35, and the materials cited previously for the lower electrode 21, or electrode materials generally used in semiconductor processes, such as Al, Ta, Cr, Cu, or the like, and combinations of these, can be used for same. There are no particular restrictions on the thicknesses of the electrodes, and a thickness of 50 to 500 nm is desirable.

There are no particular restrictions on the composition of the piezoelectric film 22, which may be constituted by any commonly known piezoelectric body. There are no particular restrictions on the thickness of the piezoelectric film 22, which is normally 1 μm or above and may be in the range of 1 to 10 μm. A piezoelectric body made of one or two or more perovskite type oxides expressed by the general formula (P) below (the piezoelectric body may also include unavoidable impurities) is desirable due to having good piezoelectric properties.

General formula: $ABO_3$ (P)

(where "A" denotes A site element, and at least one type of element selected from a group consisting of Pb, Ba, Sr, Bi, Li, Na, Ca, Cd, Mg, K and lanthanides;

"B" denotes B site element, and at least one type of element selected from a group consisting of Ti, Zr, V, Nb, Ta, Cr, Mo, W, Mn, Mg, Sc, Co, Cu, In, Sn, Ga, Zn, Cd, Fe, Ni, Hf, and Al;

"O" denotes oxygen; and the standard mol ratio of the A-site element, the B-site element and the oxygen is 1:1:3, but this mol ratio may deviate from the standard mol ratio within a range which enables a perovskite structure to be obtained.)

There are no particular restrictions on the film forming method for the piezoelectric film 22, and possible examples are a vapor phase method, such as sputtering, plasma CVD, MOCVD, PLD, and the like; a liquid phase method, such as sol gelation or an organic metal decomposition method; and an aerosol deposition method, and the like. From the viewpoint of achieving mass production and improving yield, it is desirable to form the electrode and the piezoelectric film directly onto the structural body. If the piezoelectric film is formed by sputtering, it is possible to employ a sputtering apparatus as described in Japanese Patent Application Publication No. 2008-081803, using the film formation conditions described in Japanese Patent Application Publication No. 2008-081801, Japanese Patent Application Publication No. 2008-081802 or Japanese Patent Application Publication No. 2008-106353, for example. By means of a sputtering method employing the stated film formation conditions and sputtering apparatus, it is possible to obtain a piezoelectric film with extremely good piezoelectric qualities having spontaneous polarization P from the lower electrode side toward the upper electrode side. The piezoelectric film is not limited to a PZT material and may be made of any piezoelectric material, provided that it is polarized spontaneously upon formation. It is also possible to obtain similar spontaneous polarization using a PLD, CVD or sol gelation method, or the like, for forming the piezoelectric film, if there is asymmetrical charge distribution in the film thickness direction (see Applied Physics Letters, Vol. 68, p. 484; Journal of Japanese Applied Physics, Vol. 38, p. 5364, etc.)

FIG. 4A shows a cross-sectional diagram during driving in a case where the piezoelectric drive type MEMS element 1 shown in FIG. 1 is used as a switch.

When the piezoelectric drive type MEMS element 1 is used as a switch, then as shown by the schematic drawing in FIG. 4A, the lower electrode 21 and the upper electrode 23 are connected to a power source 40, and a voltage is applied to the piezoelectric film 22 between the electrodes 21 and 23 in such a manner that the potential of the lower electrode 21 is higher than the potential of the upper electrode 23. When voltage is applied to the piezoelectric film 22, the movable part 16 is displaced in a convex shape, and the movable electrode 25 of the central portion of the surface of the movable part 16 contacts the fixed electrode 35, and the switch thus switches to an on state. The switch is switched on and off by turning the application of voltage to between the electrodes 21 and 23 on and off.

Figure 4B:
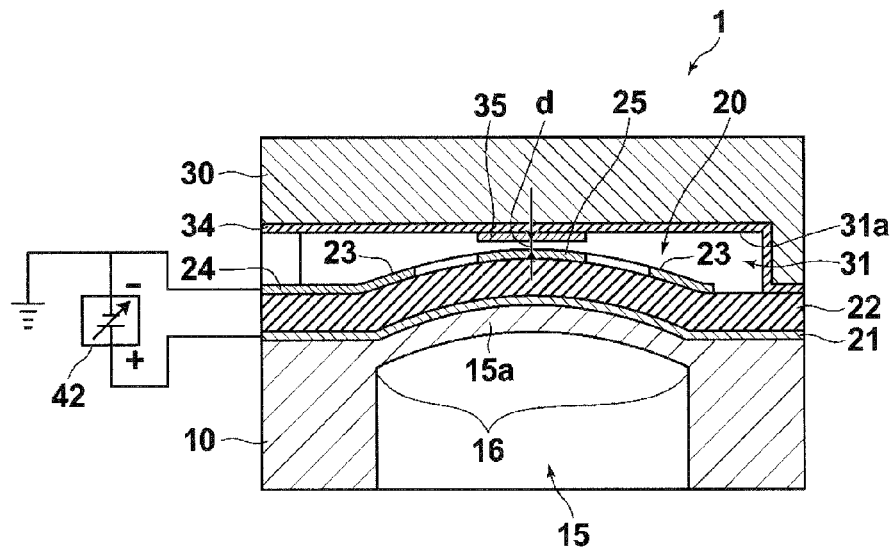
FIG. 4B is a cross-sectional diagram showing a state during driving in a case where the MEMS element shown in FIG. 1 is used as a variable capacitor.

The piezoelectric drive type MEMS element 1 according to the present embodiment can also be used as a variable capacitor, as well as a switch. FIG. 4B shows a cross-sectional diagram during driving of a case where the piezoelectric drive type MEMS element 1 shown in FIG. 1 is used as a variable capacitor.

When used as a variable capacitor, as indicated in schematic view in FIG. 4B, the lower electrode 21 and the upper electrode 23 are connected to a variable power source 42. In the present embodiment, voltage is applied in such a manner that the lower electrode 21 has a higher potential than the upper electrode 23. If the voltage applied between the electrodes 21 and 23 is changed, then the diaphragm 15a is driven, the distance d between the movable electrode 25 and the fixed electrode 35 changes, and the capacitance of the capacitor between the electrodes alters.

When the applied voltage was changed from 0 to 7 V using a piezoelectric drive type MEMS element having the composition according to the present embodiment, it was possible to change the capacitance from 100 pF to 1.5 pF.

Method of Manufacturing Piezoelectric Drive Type MEMS Element

Next, an embodiment of a method of manufacturing a piezoelectric drive type MEMS element 1 according to an embodiment of the present invention will be described. Here, a method of manufacturing a piezoelectric drive type MEMS element 1 is described, in which the piezoelectric drive type MEMS element 1 comprises: a first substrate 10 comprising a diaphragm 15a forming a portion of the surface of the substrate; a lower electrode 21 formed on the diaphragm 15a of the surface of the first substrate 10; a piezoelectric film 22 formed on the lower electrode 21; an upper electrode 23 formed along the region corresponding to the peripheral edge of the diaphragm 15a on the piezoelectric film 22; a movable electrode 25 formed on a region of the piezoelectric film 22 corresponding to the central portion of the diaphragm 15a; a second substrate 30 comprising a recess section 31 on one surface thereof, the bottom face 31a of the recess section 31 being fixed to the portion of the first substrate 10 which does not form the diaphragm 15a, so as to face the front surface of the first substrate 10; and a fixed electrode 35 provided on the bottom face 31a of the recess section 31 of the second substrate 30 in a position opposing the movable electrode 25. FIGS. 5A to 5E are cross-sectional diagrams showing steps for manufacturing a piezoelectric drive type MEMS element 1.

The manufacturing steps at least include: a step of forming a first substrate of which the diaphragm constitutes a portion of the surface; a step of forming a lower electrode on the first substrate; a step of forming a piezoelectric film on the lower electrode; a step of forming an upper electrode on a region of the piezoelectric film corresponding to the peripheral edge of the diaphragm and forming a movable electrode on a region of the piezoelectric film corresponding to the central portion of the diaphragm; a step of forming a second substrate comprising a recess section on one surface and comprising a fixed electrode on the central portion of the bottom face of the recess section; and a step of bonding the first substrate on which the upper electrode and the movable electrode are provided and the second substrate in such a manner that the fixed electrode and the movable element face each other.

Figure 5A:
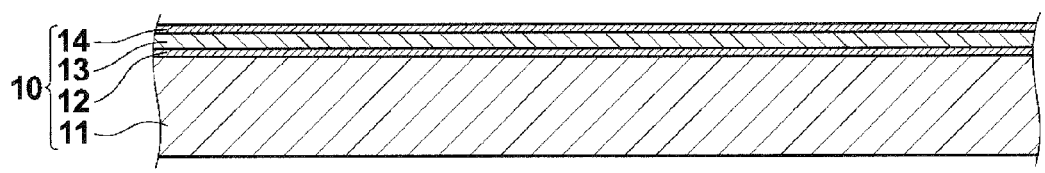
FIG. 5A is a cross-sectional diagram showing a process for manufacturing a piezoelectric device according to the first embodiment (first step)

Firstly, as shown in FIG. 5A, an SOI wafer substrate having an $SiO_2$ film 14 provided on the surface, a 4 μm-thick device Si layer 13, a 0.3 μm-thick $SiO_2$ layer 12 and a 300 μm-thick handle layer 11, is prepared as a first substrate 10.

Figure 5B:
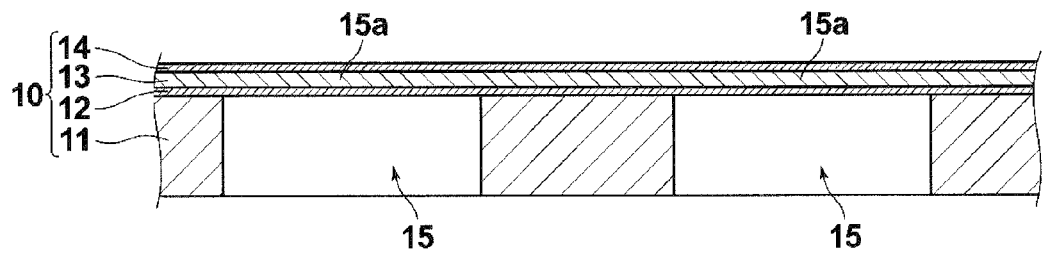
FIG. 5B is a cross-sectional diagram showing the process for manufacturing a piezoelectric device according to the first embodiment (second step)

Thereupon, as shown in FIG. 5B, an excavation pattern is formed by lithography on the rear surface of the SOI wafer substrate 10, the silicon is excavated by a Bosch process, and etching is carried out up to the $SiO_2$ layer 12, which forms an etching stop layer, thereby creating cavities 15. The diameter of the opening of the cavities 15 is 700 μm, for example. A surface portion constituted by the $SiO_2$ layer 12, the device layer 13 and the surface $SiO_2$ film 14 situated over a cavity 15 forms a diaphragm 15a.

Figure 5C:
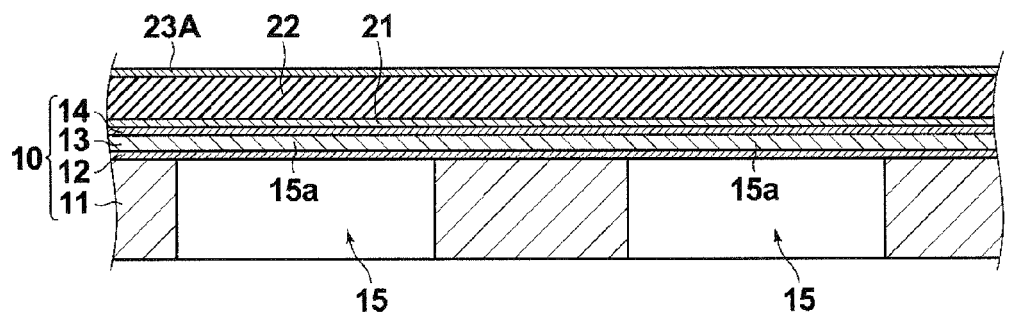
FIG. 5C is a cross-sectional diagram showing the process for manufacturing a piezoelectric device according to the first embodiment (third step)

As shown in FIG. 5C, a lower electrode 21 is then formed by sputtering on the surface of the substrate 10. The lower electrode 21 is composed, for example, as Ti 20 nm/Pt 100 nm.

A piezoelectric film 22 is deposited on the lower electrode 21 by a magnetron sputtering process. The piezoelectric film 22 is formed by a 2 μm-thick PZT film, for example.

Moreover, an upper electrode layer 23A is deposited on top of the piezoelectric film 22.

Figure 5D:
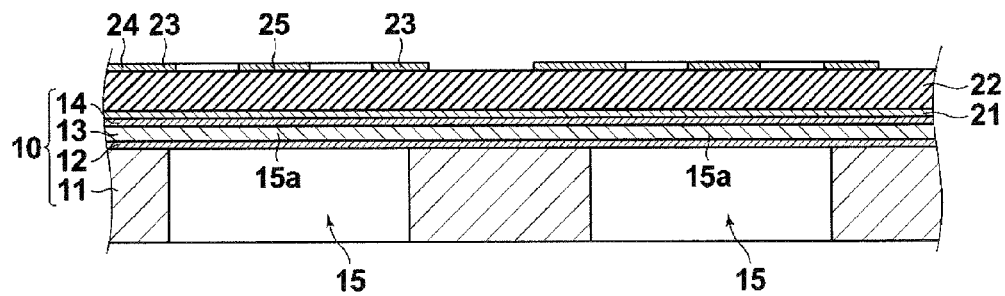
FIG. 5D is a cross-sectional diagram showing the process for manufacturing a piezoelectric device according to the first embodiment (forth step)

This upper electrode layer 23A is then patterned by lithographic etching. The upper electrode layer 23A is formed, for example, by Cr 20 nm/Au (150 nm), and is patterned by successively wet etching the Au and Cr. As shown in FIG. 5D, upper electrodes 23, electrical wires 24 for the upper electrodes, movable electrodes (signal electrodes) 25, electrical wires 26 for the movable electrode, and electrodes for bonding with the second substrate (not illustrated) are formed simultaneously from this upper electrode layer 23A. Here, the reason for using gold (Au) for the surface layer of the upper electrode layer 23A is because of its resistance to oxidation and high contact reliability.

In a further step, a separately prepared silicon wafer substrate is taken as a second substrate 30, and recess sections 31 having a depth of approximately 1 μm in regions corresponding to the movable parts 16 of the first substrate 10 are provided in one face of this second substrate 30, and wiring groove sections 32, 33 are provided simultaneously (see FIG. 3). An $SiO_2$ film 34 is formed on the surface layer on the face of the silicon wafer substrate 30 where the recess sections 31 are provided, whereupon a fixed electrode 35 is formed in the central portion of the bottom face 31a of each recess section 31, and a lead wire 36 from the fixed electrode 35 is formed simultaneously. The fixed electrode 35 and the lead wire 36 can be formed by depositing an electrode layer on the bottom face 31a of the recess section 31 and then patterning by lithography and etching. Simultaneously with this, electrodes for bonding (not illustrated) are formed in the sections of the second substrate 30 which bond with the first substrate.

Figure 5E:
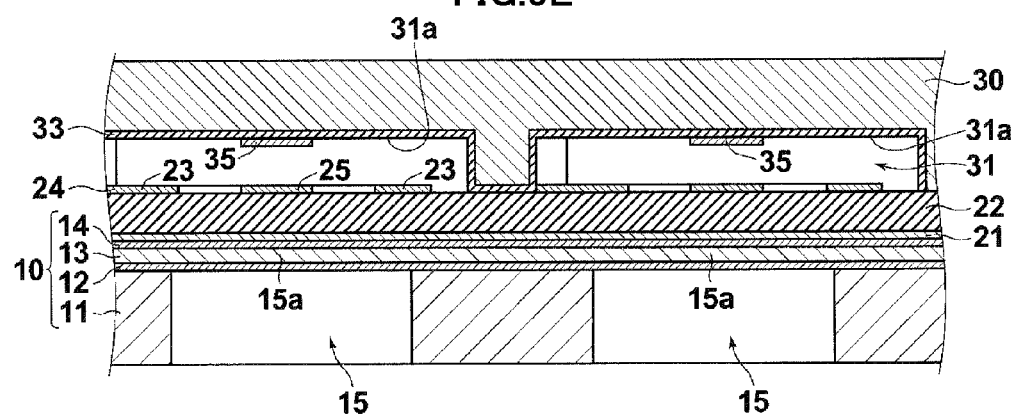
FIG. 5E is a cross-sectional diagram showing the process for manufacturing a piezoelectric device according to the first embodiment (fifth step)

As shown in FIG. 5E, the second substrate 30 comprising a silicon wafer substrate on which fixed electrodes 35 and wires 36 are formed is aligned with and bonded to the first substrate 10 comprising a SOI wafer substrate on which the movable parts 16 and the piezoelectric drive sections 20 are formed, in such a manner that the respective fixed electrodes 35 and movable electrode 25 are mutually facing. In this case, the substrates can be bonded together by maintaining a temperature of 250° C. and a pressure of 4 MPa for four hours, for example, in a state where both substrates are registered in position and placed in contact with each other, in other words, a state where the bonding electrodes provided on both the substrates are in mutual contact.

Finally, the wafer created by bonding the first substrate 10 and the second substrate 30 is diced to create individual chips, whereby it is possible to obtain a piezoelectric drive type MEMS element according to the present embodiment.

Compared to the method of manufacture of the element described in Japanese Patent Application Publication No. 2005-313274, the method of manufacture described above does not require complicated steps for creating and removing a sacrificial layer, and hence the piezoelectric drive type MEMS element according to the first embodiment can be manufactured by means of a simple process, and therefore yield can be improved and manufacturing costs can be restricted.

Figure 6A:
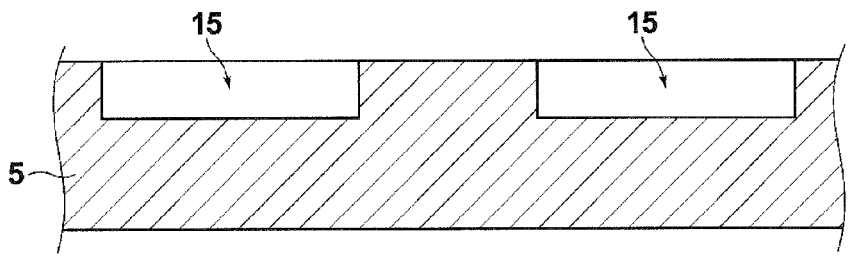
FIG. 6A is a cross-sectional diagram showing a further process for manufacturing a first substrate (first step)
Figure 6B:
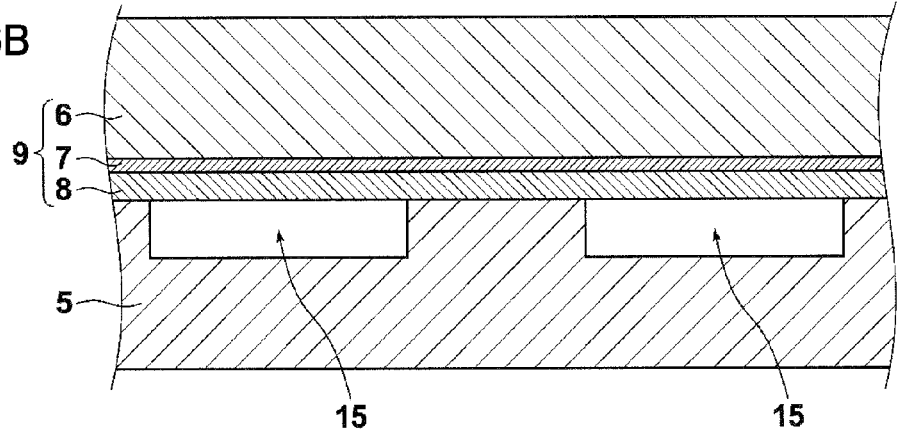
FIG. 6B is a cross-sectional diagram showing the further process for manufacturing a first substrate (second step)
Figure 6C:
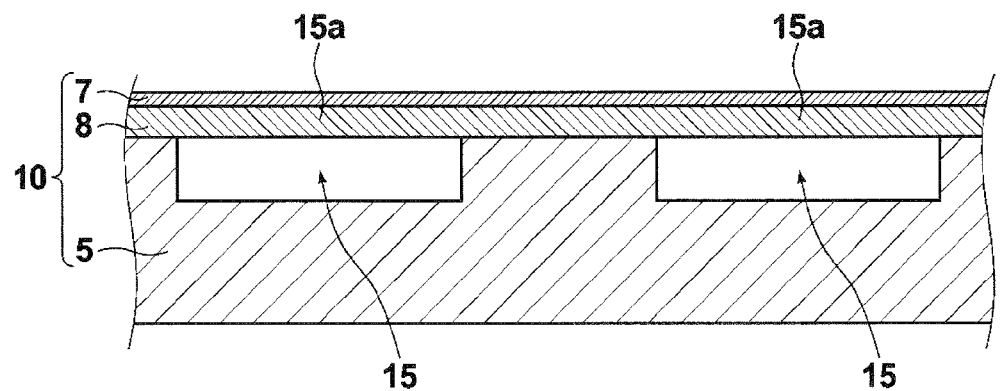
FIG. 6C is a cross-sectional diagram showing the further process for manufacturing a first substrate (third step)

In the method of manufacture described above, the SOI wafer substrate is etched from the rear surface to create the cavities 15 and diaphragms 15a, but FIGS. 6A to 6C show another process for manufacturing a substrate comprising diaphragms 15a.

Firstly, as shown in FIG. 6A, cavities 15 which are open on the upper surface are provided in a silicon wafer substrate 5.

Next, as shown in FIG. 6B, two wafer substrates 5 and 9 are bonded together in such a manner that a device layer 8 side of the SOI wafer substrate 9, which comprises a handle layer 6, an $SiO_2$ layer 7 and a device layer 8, contacts the upper face of the silicon wafer 5 and closes off the cavities 15.

Finally, by removing the handle layer 6 of the SOI wafer substrate 9, as shown in FIG. 6C, it is possible to manufacture a first substrate 10 comprising the silicon wafer substrate 5, the device layer 8 and the $SiO_2$ layer 7, which comprises diaphragms 15a that form a portion of the surface thereof.

According to the method of manufacture described above, it is possible to create a cavity array having higher accuracy and better uniformity.

Figure 7:
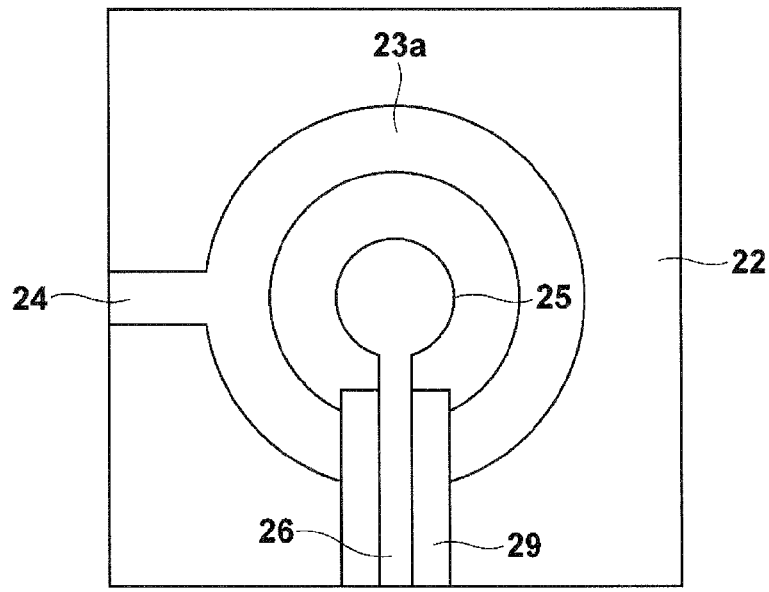
FIG. 7 is a plan diagram showing an example of a design modification of an upper electrode.
Figure 8:
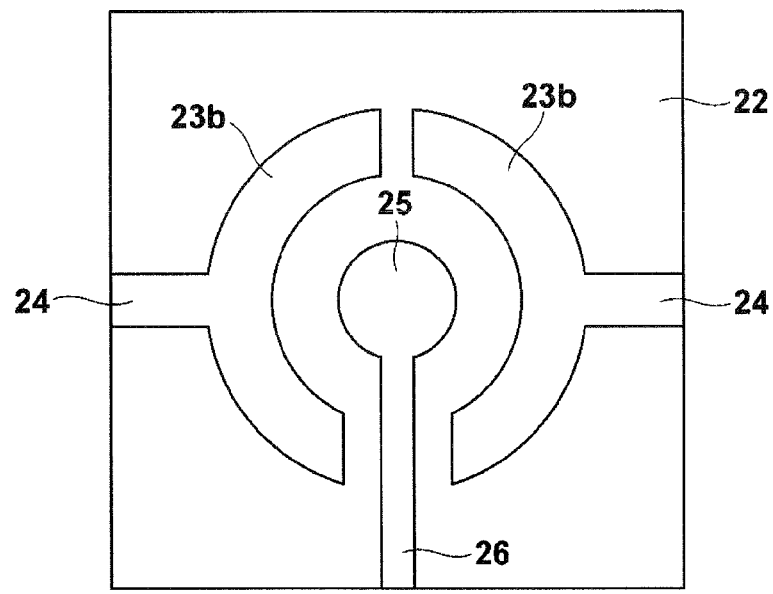
FIG. 8 is a plan diagram showing a further example of a design modification of the upper electrode.

The MEMS element 1 according to the embodiment described above is an example comprising a C-shaped electrode, which is one mode of a non-continuous ring electrode, as the upper electrode 23, but the upper electrode may also be formed as a continuous ring electrode 23a as shown in FIG. 7, or may be formed as divided non-continuous ring electrodes 23b and 23b which are divided at two or more locations as shown in FIG. 8. As shown in FIG. 7, when a ring electrode 23a is used as the upper electrode, desirably, an insulating film 29 should be provided between the lead wire from the movable electrode 25 which is disposed to the inner side of the inner diameter of the upper electrode and the upper electrode 23a, in order to prevent contact between same.

Application Example

Below, an application example of the piezoelectric drive type MEMS element 1 according to the present embodiment will be described briefly.

Figure 9:
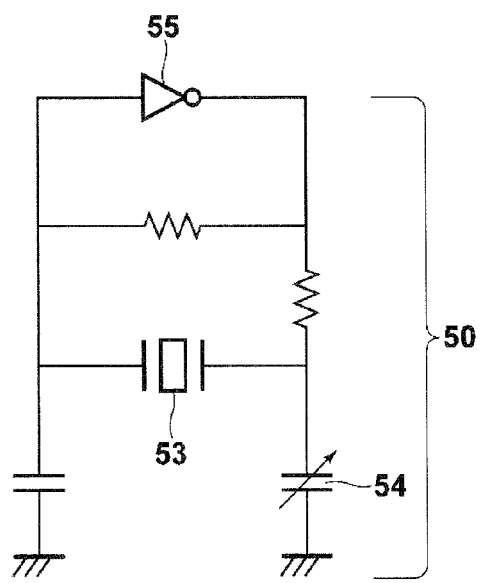
FIG. 9 is a circuit diagram showing the composition of a piezoelectrically controlled oscillator equipped with the piezoelectric drive type MEMS element according to the first embodiment.

FIG. 9 is a circuit diagram of a voltage control oscillator (VCO) 50 in which the piezoelectric drive type MEMS element 1 described above is used as a variable capacitor.

As shown in FIG. 9, by combining a variable capacitor 54 constituted by the piezoelectric drive type MEMS element 1 with a thin film piezoelectric resonator 53 and an amplifier 55, the capacitor can be used as a voltage control oscillator 50 employed in a movable (mobile) communications apparatus.

Figure 10:
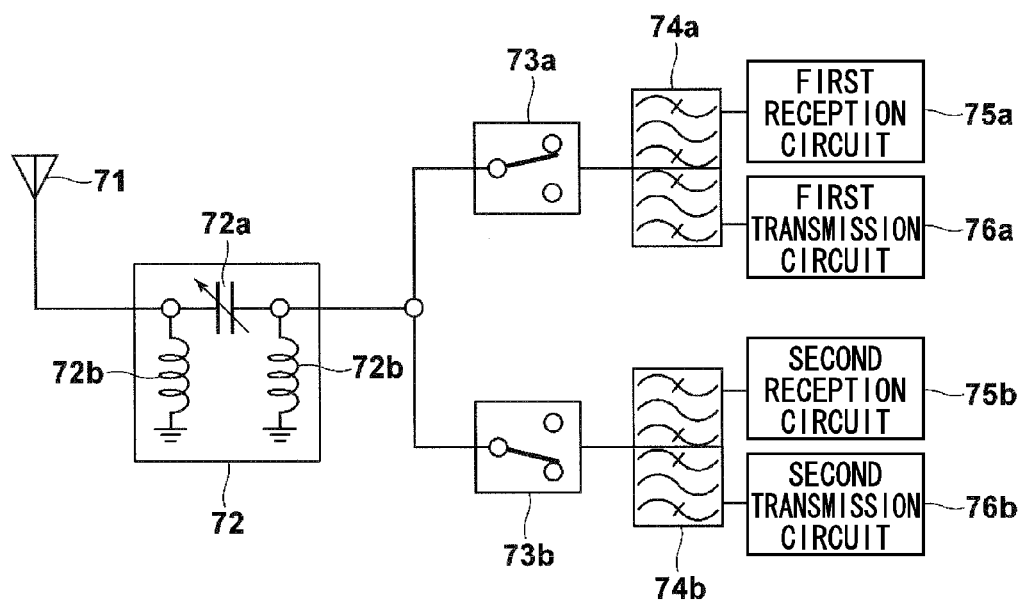
FIG. 10 is a circuit diagram showing the composition of a two-band mobile communications apparatus equipped with the piezoelectric drive type MEMS element according to the first embodiment.

FIG. 10 is a circuit diagram showing the composition of a two-band mobile communications apparatus in which a piezoelectric drive type MEMS element 1 as described above is used as a switch and a variable capacitor.

This two-band mobile communications apparatus comprises an antenna 71, a tunable matching circuit 72, band switches 73a, 73b, transmission/reception switching devices 74*a*, 74*b*, a first reception circuit 75*a*, a first transmission circuit 76*a*, a second reception circuit 75*b* and a second transmission circuit 76*b*.

The tunable matching circuit 72 is constituted by combining a variable capacitor 72*a* which is formed by a piezoelectric drive type MEMS element 1, and an inductor element 72*b*, and by using this tunable matching circuit 72, it is possible to achieve high gain with respect to a plurality of carrier waves having different frequencies, while using the same antenna, for instance.

Furthermore, here, the piezoelectric drive type MEMS element 1 is also used as band switches 73*a* and 73*b*. By using a piezoelectric drive type MEMS switch, it is possible to achieve low insertion loss when the switch is on and high insulating separation characteristics when the switch is off, compared to a high-frequency switch which uses a normal semiconductor element.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric drive type MEMS element comprising:
a first substrate including, in a portion thereof, a movable part which is driven by a piezoelectric drive section to be displaced in a convex shape, a movable electrode being provided on a surface of the movable part; and
a second substrate which is bonded to the first substrate and supports a fixed electrode facing the movable electrode via a prescribed gap,
wherein the piezoelectric drive section includes a piezoelectric film provided on a region of the first substrate which forms the movable part as a portion of the movable part, and a pair of electrodes disposed so as to sandwich the piezoelectric film.

2. The piezoelectric drive type MEMS element as defined in claim 1, wherein:
the first substrate includes a diaphragm as a portion of a surface thereof;
the pair of electrodes are composed of a lower electrode which is formed on the first substrate, and an upper electrode which is provided along a region corresponding to a peripheral edge of the diaphragm, on the piezoelectric film formed on the lower electrode; and
the movable part includes the diaphragm, the lower electrode provided on the diaphragm, and the piezoelectric film.

3. The piezoelectric drive type MEMS element as defined in claim 1, wherein:
the second substrate has a recess section in a surface thereof and is bonded to the first substrate in such a manner that a bottom face of the recess section faces a surface of the first substrate; and
the fixed electrode is provided at a position facing the movable electrode, on the bottom face of the recess section of the second substrate.

4. The piezoelectric drive type MEMS element as defined in claim 2, wherein a peripheral edge of the movable part is circular, and the upper electrode is a continuous or non-continuous ring electrode formed along the peripheral edge.

5. The piezoelectric drive type MEMS element as defined in claim 4, wherein an outer circumferential diameter of the ring electrode is greater than a diameter of the peripheral edge of the movable part, and an inner circumferential diameter of the ring electrode is smaller than the diameter of the peripheral edge of the movable part.

6. The piezoelectric drive type MEMS element as defined in claim 2, wherein:
the piezoelectric film has a spontaneous polarization which is oriented in a direction from the lower electrode toward the upper electrode; and
when a voltage is applied between the lower electrode and the upper electrode in such a manner that a potential of the lower electrode is higher than a potential of the upper electrode, the movable part is driven and displaced in a direction such that the movable electrode moves towards the fixed electrode.

7. The piezoelectric drive type MEMS element as defined in claim 1, wherein when a voltage is applied between the pair of electrodes, the movable part is driven and displaced in such a manner that the movable electrode makes contact with the fixed electrode to serve as a switch.

8. The piezoelectric drive type MEMS element as defined in claim 1, wherein when a variable voltage is applied between the pair of electrodes, the movable part is driven and displaced in such a manner that a distance between the movable electrode and the fixed electrode is changed to serve as a variable capacitor.

9. The piezoelectric drive type MEMS element as defined in claim 2, wherein the diaphragm has a circular shape.

10. The piezoelectric drive type MEMS element as defined in claim 1, wherein the piezoelectric film contains a perovskite type oxide.

11. The piezoelectric drive type MEMS element as defined in claim 1, wherein the movable electrode is provided in a region corresponding to a central portion of the surface of the movable part.

12. A voltage control oscillator comprising:
a variable capacitor formed by the piezoelectric drive type MEMS element defined in claim 8;
a resonator connected to the variable capacitor; and
an amplifier connected to the variable capacitor.

13. A communication apparatus comprising:
an antenna; and
a matching circuit which is connected to the antenna and includes an inductor element and a variable capacitor formed by the piezoelectric drive type MEMS element defined in claim 8.

14. A communication apparatus comprising:
an antenna;
a matching circuit connected to the antenna;
a first band switch and a second band switch each of which is connected to the matching circuit and formed by the piezoelectric drive type MEMS element defined in claim 7;
a first transmit-receive circuit connected to the first band switch; and
a second transmit-receive circuit connected to the second band switch.

* * * * *